United States Patent
Im et al.

(10) Patent No.: US 11,309,437 B2
(45) Date of Patent: Apr. 19, 2022

(54) VERTICAL SCHOTTKY BARRIER DIODES USING TWO-DIMENSIONAL LAYERED SEMICONDUCTORS AND FABRICATION METHODS THEREOF

(71) Applicant: INDUSTRY-ACADEMIC COOPERATION FOUNDATION, YONSEI UNIVERSITY, Seoul (KR)

(72) Inventors: Seongil Im, Seoul (KR); Sung Jin Yang, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 17/006,239

(22) Filed: Aug. 28, 2020

(65) Prior Publication Data

US 2021/0066511 A1  Mar. 4, 2021

(30) Foreign Application Priority Data

Aug. 28, 2019  (KR) .......................... 10-2019-0105778

(51) Int. Cl.
  *H01L 29/872* (2006.01)
  *H01L 29/66* (2006.01)
(52) U.S. Cl.
  CPC ...... *H01L 29/872* (2013.01); *H01L 29/66143* (2013.01)
(58) Field of Classification Search
  CPC ... H01L 29/66; H01L 29/661; H01L 29/6614; H01L 29/66143; H01L 29/87; H01L 29/872

(Continued)

(56) References Cited

U.S. PATENT DOCUMENTS

2020/0350441 A1\* 11/2020 Alkhalil ............ H01L 29/66143

FOREIGN PATENT DOCUMENTS

| KR | 101792953 B1 | 11/2017 |
| KR | 20190000089 A2 | 1/2019 |
| KR | 20190063483 A | 6/2019 |

OTHER PUBLICATIONS

Chasin, A. et al., "High-performance a-In—Ga—Zn—P Schottky diode with oxygen-treated metal contacts," Applied Physics Letters, vol. 101, No. 11, Available Online Sep. 12, 2012, 6 pages.

(Continued)

*Primary Examiner* — Monica D Harrison
(74) *Attorney, Agent, or Firm* — McCoy Russell LLP

(57) ABSTRACT

Provided are a vertical Schottky barrier diode using a two-dimensional layered semiconductor and a fabrication method thereof, the vertical Schottky barrier diode having excellent response characteristics in a high frequency region and capable of being directly fabricated from a material having a low melting point such as glass or plastic because its fabrication process is performed at a relatively low temperature. The vertical Schottky barrier diode includes: an ohmic contact layer formed of a metal; a two-dimensional layered semiconductor formed of two-dimensional transition metal dichalcogenides (TMDs) on one surface of the ohmic contact layer; a Schottky contact layer formed on one surface of the two-dimensional layered semiconductor; and a non-conductive layer formed on the other surface of the ohmic contact layer or one surface of the Schottky contact layer.

16 Claims, 8 Drawing Sheets

(58) Field of Classification Search
 USPC .......................................................... 257/471
 See application file for complete search history.

(56) References Cited

OTHER PUBLICATIONS

Moun, M. et al., "Study of Electrical Behavior of Metal-Semiconductor Contacts on Exfoliated MoS2 Flakes," Physica Status Solidi (a), vol. 215, No. 14, Jun. 20, 2018, 6 pages.

* cited by examiner

VERTICAL SCHOTTKY BARRIER DIODES USING TWO-DIMENSIONAL LAYERED SEMICONDUCTORS AND FABRICATION METHODS THEREOF

CROSS-REFERENCE TO RELATED APPLICATIONS

The present application claims priority to Korean Patent Application No. 10-2019-0105778 filed on Aug. 28, 2019. The entire contents of the above-listed application is hereby incorporated by reference for all purposes.

TECHNICAL FIELD

The following disclosure relates to a vertical Schottky barrier diode using a two-dimensional layered semiconductor and a fabrication method thereof.

BACKGROUND

A diode may refer to a semiconductor device controlling current to flow in only one direction. A general semiconductor diode may have a PN junction surface and have a high threshold voltage of about 0.6 to 0.7 V. Therefore, the semiconductor diode may require reverse recovery time due to a phenomenon in which when power is turned off, the power is not immediately turned off due to a few carriers remaining inside the semiconductor diode and more current flows for a while. On the contrary, a Schottky (barrier) diode may have a metal-semiconductor junction surface rather than the PN junction surface and thus have a threshold voltage, which is about half that of the general semiconductor diode. Therefore, the Schottky diode may require very short reverse recovery time because there is no accumulation effect due to current flowing through a plurality of carriers rather than the few carriers. Accordingly, the Schottky diode may be often used for low voltage and high current, high speed rectification, etc.

A conventional Schottky diode has often been implemented using silicon or gallium arsenide (GaAs). The Schottky diode fabricated from such a material may have excellent response characteristics in a high frequency region, but have limited applicable targets due to lack of flexibility. In addition, such a Schottky diode may require a high-temperature process (of about 1000° C.), and may thus be difficult to be directly implemented using a material which is economical and has a low melting point such as glass or plastic. Accordingly, the Schottky diode may necessarily require a process of being fabricated separately and then attached to the glass or the plastic, making its fabrication not easy and its production cost increased. A low-temperature process may be possible for a conventional Schottky diode in case that a semiconductor layer formed of silicon or gallium arsenide is implemented as an oxide semiconductor or an organic semiconductor, and the Schottky diode may thus be directly implemented on a glass or plastic substrate. However, the response characteristics in the high frequency region may be degraded due to material characteristics of the oxide semiconductor or the organic semiconductor.

RELATED ART DOCUMENT

Patent Document (Patent Document 0001) Korean Patent Laid-Open Publication No. 10-2019-0063483 ("SCHOTTKY DIODE", published on Jun. 7, 2019)

SUMMARY

An embodiment of the present disclosure is directed to providing a vertical Schottky barrier diode using a two-dimensional layered semiconductor and a fabrication method thereof, the vertical Schottky barrier diode having excellent response characteristics in a high frequency region and capable of being directly fabricated from a material having a low melting point such as glass or plastic because its fabrication process is performed at a relatively low temperature.

In one general aspect, a vertical Schottky barrier diode includes: an ohmic contact layer formed of a metal; a two-dimensional layered semiconductor formed of two-dimensional transition metal dichalcogenides (TMDs) on one surface of the ohmic contact layer; a Schottky contact layer formed on one surface of the two-dimensional layered semiconductor; and a non-conductive layer formed on the other surface of the ohmic contact layer or one surface of the Schottky contact layer.

In addition, the two-dimensional transition metal dichalcogenides (TMDs) forming the two-dimensional layered semiconductor may contain any one selected from a group consisting of tungsten diselenide ($WSe_2$), tungsten disulfide ($WS_2$), molybdenum diselenide ($MoSe_2$), molybdenum disulfide ($MoS_2$), molybdenum ditelluride ($MoTe_2$), rhenium diselenide ($ReSe_2$) and rhenium disulfide ($ReS_2$).

In addition, the two-dimensional layered semiconductor may be formed to have a thickness of 10 nm or more.

In addition, the Schottky contact layer may be formed of a Schottky metal or a conductive transparent oxide film.

In addition, the non-conductive layer may be formed of any one selected from glass, plastic and polyimide.

In addition, the non-conductive layer may be formed of a transparent material or an opaque material.

In addition, the non-conductive layer may be hard by being formed of a material having predetermined rigidity or more or may be flexible by being formed of a material having elasticity.

In addition, the vertical Schottky barrier diode may further include a non-conductive member formed on a portion of the one surface of the two-dimensional layered semiconductor and in surface contact with the two-dimensional layered semiconductor and the Schottky contact layer.

In addition, the non-conductive member may be formed at an edge of the one surface of the two-dimensional layered semiconductor.

In another general aspect, a fabrication method of a vertical Schottky barrier diode includes: a step A of forming an ohmic contact layer on one surface of a non-conductive layer using a metal or forming a Schottky contact layer on the one surface of a non-conductive layer; a step B of forming a two-dimensional layered semiconductor on one surface of the layer formed in the step A using two-dimensional transition metal dichalcogenides (TMDs); and a step C of forming the layer not formed in the step A among the ohmic contact layer and the Schottky contact layer on the one surface of the two-dimensional layered semiconductor formed in the step B.

In addition, in the step A or C, the ohmic contact layer or the Schottky contact layer may be formed using dry transfer, wet transfer, thin film deposition or patterning processes.

In addition, in the step B, the two-dimensional layered semiconductor may be formed by attaching the two-dimensional layered semiconductor attached to a surface of an adhesive member to the one surface of the layer formed in the step A, and then removing the adhesive member.

In addition, the ohmic contact layer may be formed on the one surface of the non-conductive layer in the step A, the fabrication method of a vertical Schottky barrier diode may further include a step B-1 of forming a non-conductive member on a portion of the one surface of the two-dimensional layered semiconductor, the step B-1 being performed between the step B and the step C.

In addition, the Schottky contact layer may be formed on the one surface of the non-conductive layer in the step A, the fabrication method of a vertical Schottky barrier diode may further include a step B-1 of forming a non-conductive member on a portion of the one surface of the two-dimensional layered semiconductor, the step B-1 being performed between the step B and the step C.

In addition, in the step B-1, the non-conductive member may be formed at an edge of the one surface of the two-dimensional layered semiconductor.

In addition, in the step B-1, the non-conductive member may be formed using a photoresist method.

In addition, the two-dimensional transition metal dichalcogenides (TMDs) forming the two-dimensional layered semiconductor may contain any one selected from a group consisting of tungsten diselenide ($WSe_2$), tungsten disulfide ($WS_2$), molybdenum diselenide ($MoSe_2$), molybdenum disulfide ($MoS_2$), molybdenum ditelluride ($MoTe_2$), rhenium diselenide ($ReSe_2$) and rhenium disulfide ($ReS_2$).

In addition, in the step B, the two-dimensional layered semiconductor may be formed to have a thickness of 10 nm or more.

In addition, the Schottky contact layer may be formed of a Schottky metal or a conductive transparent oxide film.

In addition, the non-conductive layer may be formed of any one selected from glass, plastic and polyimide.

In addition, the non-conductive layer may be formed of a transparent material or an opaque material.

In addition, the non-conductive layer may be hard by being formed of a material having predetermined rigidity or more or may be flexible by being formed of a material having elasticity.

Other features and aspects are apparent from the following detailed description, the drawings and the claims.

DETAILED DESCRIPTION

Hereinafter, a vertical Schottky barrier diode using a two-dimensional layered semiconductor according to embodiments of the present disclosure is described in detail with reference to the accompanying drawings; and for convenience of explanation, this vertical Schottky barrier diode using the two-dimensional layered semiconductor may be abbreviated as the vertical Schottky barrier diode.

[Vertical Schottky Barrier Diode: First Embodiment]

Figure 1:
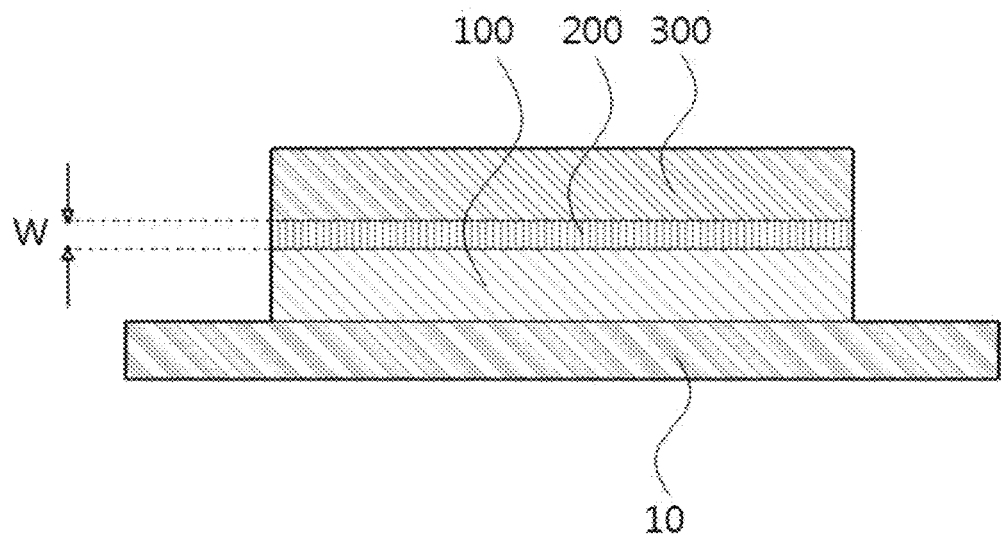
FIG. 1 is a cross-sectional view of a vertical Schottky barrier diode using a two-dimensional layered semiconductor according to a first embodiment of the present disclosure.

FIG. 1 is a schematic cross-sectional view of a vertical Schottky barrier diode according to a first embodiment of the present disclosure.

As shown in FIG. 1, the vertical Schottky barrier diode according to the first embodiment of the present disclosure includes: a non-conductive layer 10; an ohmic contact layer 100; a two-dimensional layered semiconductor 200; and a Schottky contact layer 300, in which the layers are sequentially formed from a bottom of the vertical Schottky barrier diode.

The non-conductive layer 10 positioned at the bottom of the vertical Schottky barrier diode according to the first embodiment of the present disclosure may be formed of a material through which current is unable to flow as its name suggests. In the embodiment, the non-conductive layer 10 may be formed of one or more materials selected from glass, plastic and polyimide. The non-conductive layer 10 may be hard with rigidity of a predetermined degree or more or flexible with a predetermined degree or more of elasticity, depending on a type of material forming the non-conductive layer 10. The non-conductive layer 10 may be formed of a transparent material or an opaque material. That is, the non-conductive layer 10 may have hard/transparent, hard/opaque, flexible/transparent or flexible/opaque characteristics.

The ohmic contact layer 100 shown in FIG. 1 may be formed of a metal on a top surface of the non-conductive layer 10 to make ohmic contact with the two-dimensional layered semiconductor 200 to be described below. The metal forming the ohmic contact layer 100 based on an N-type semiconductor may have a smaller work function than the two-dimensional layered semiconductor 200 in contact with the ohmic contact layer 100. On the contrary, the metal forming the ohmic contact layer 100 based on a P-type semiconductor may have a larger work function than the two-dimensional layered semiconductor 200 in contact with the ohmic contact layer 100. In the embodiment, the ohmic contact layer 100 may be formed of platinum (Pt) or graphene, but in the present disclosure, the material of the ohmic contact layer 100 is not limited to the platinum or graphene.

As shown in FIG. 1, the two-dimensional layered semiconductor 200 may be formed of two-dimensional transition metal dichalcogenides (TMDs) on a top surface of the ohmic contact layer 100. An example of the two-dimensional transition metal dichalcogenides (TMDs) capable of forming the two-dimensional layered semiconductor 200 in the present embodiment may contain any one selected from a group consisting of tungsten diselenide ($WSe_2$), tungsten disulfide ($WS_2$), molybdenum diselenide ($MoSe_2$), molybdenum disulfide ($MoS_2$), molybdenum ditelluride ($MoTe_2$), rhenium diselenide ($ReSe_2$) and rhenium disulfide ($ReS_2$).

The two-dimensional layered semiconductor 200 may be formed to have a thickness W of 10 nm or more to prevent the current from flowing between the ohmic contact layer 100 and the Schottky contact layer 300 respectively formed on the top and bottom surfaces of the two-dimensional layered semiconductor 200. That is, in case that the two-dimensional layered semiconductor 200 is formed to have a thickness of less than 10 nm, the current may flow between the ohmic contact layer 100 and the Schottky contact layer 300, and thus the Schottky diode according to the first embodiment of the present disclosure may not function as a diode. Accordingly, the two-dimensional layered semiconductor 200 of the embodiment may be formed to have the thickness of 10 nm or more, and more preferably have a thickness of 10 to 100 nm.

The two-dimensional layered semiconductor 200 may be formed in the following manner: a raw material of the two-dimensional transition metal dichalcogenides forming the two-dimensional layered semiconductor 200 may be peeled off by an adhesive material on which an adhesive is applied such as a tape, and the adhesive material may be attached to the top surface of the ohmic contact layer 100 and then removed. This manner is a dry transfer or a wet transfer method using van der Waals forces, and may have improved reliability, process convenience and economical efficiency compared to a transfer method in a limited environment (e.g., an environment of a predetermined temperature or higher). In addition, the two-dimensional layered semiconductor 200 of the embodiment may be formed of the two-dimensional transition metal dichalcogenides, thereby allowing the Schottky diode according to the embodiment to be operated at high speed.

The Schottky contact layer 300 shown in FIG. 1 may be formed on a top surface of the two-dimensional layered semiconductor 200. The Schottky contact layer 300 may be formed of a metal or a conductive transparent oxide film. The metal or the conductive transparent oxide film forming the Schottky contact layer 300 based on the N-type semiconductor may have a larger work function than the two-dimensional layered semiconductor 200 formed on a bottom of the Schottky contact layer 300. On the contrary, the metal or the conductive transparent oxide film forming the Schottky contact layer 300 based on the P-type semiconductor may have a smaller work function than the two-dimensional layered semiconductor 200 formed on the bottom of the Schottky contact layer 300. In this manner, it is possible to prevent the current from flowing between the Schottky contact layer 300 and the two-dimensional layered semiconductor 200. That is, in the embodiment, the ohmic contact layer 100, the two-dimensional layered semiconductor 200 and the Schottky contact layer 300 may have work functions sequentially larger in order based on the N-type semiconductor, thereby allowing the current to only flow from the Schottky contact layer 300 to the ohmic contact layer 100 when a forward bias is applied. On the contrary, the ohmic contact layer 100, the two-dimensional layered semiconductor 200 and the Schottky contact layer 300 may have work functions sequentially smaller in order based on the P-type semiconductor, thereby allowing the current to only flow from the ohmic contact layer 100 to the Schottky contact layer 300 when the forward bias is applied.

Some representative materials forming the Schottky contact layer 300 may be indium tin oxide (ITO), titanium (Ti) and gold (Au). The Schottky contact layer 300 of the embodiment may be formed of indium tin oxide (ITO), titanium (Ti) and gold (Au); however, the Schottky contact layer 300 of the present disclosure is not limited to such materials as indium tin oxide (ITO), titanium (Ti) and gold (Au). The ohmic contact layer 100 and the Schottky contact layer 300 may be formed on the top surface of the non-conductor layer 10 and the top surface of the two-dimensional layered semiconductor 200, respectively, using dry transfer, wet transfer, thin film deposition and patterning processes.

[Vertical Schottky Barrier Diode: Second Embodiment]

Figure 2:
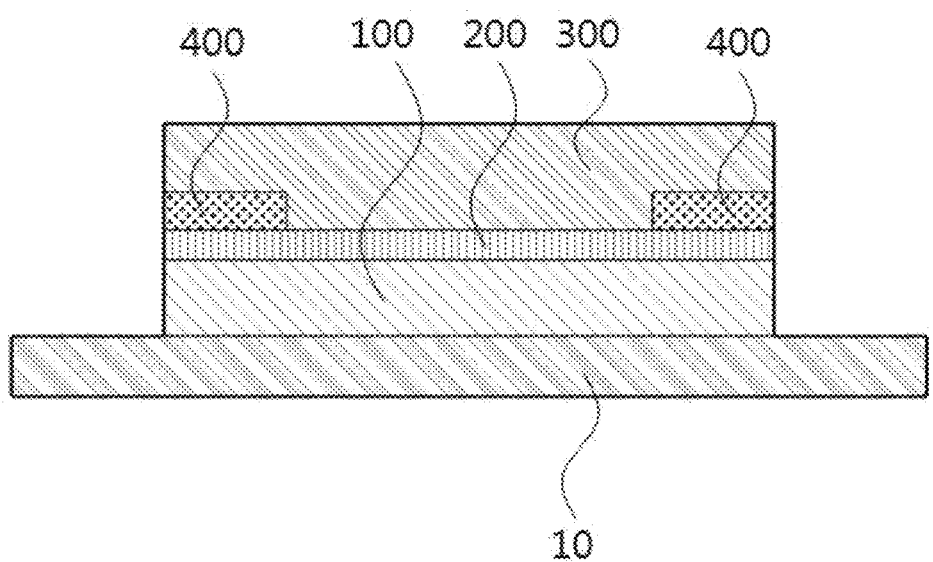
FIG. 2 is a cross-sectional view of a vertical Schottky barrier diode using a two-dimensional layered semiconductor according to a second embodiment of the present disclosure.

FIG. 2 is a schematic cross-sectional view of a vertical Schottky barrier diode according to a second embodiment of the present disclosure.

As shown in FIG. 2, the vertical Schottky barrier diode according to the second embodiment of the present disclosure may further include a non-conductive member 400 compared to the components of the vertical Schottky barrier diode according to the first embodiment of the present disclosure. Therefore, the following description focuses on the non-conductive member 400 and contents related thereto, and omitted is a description of a component of the second embodiment considered to be the same as that in the first embodiment among the components included in the vertical Schottky barrier diode according to the second embodiment of the present disclosure.

As shown in FIG. 2, in the vertical Schottky barrier diode according to the second embodiment of the present disclosure, the non-conductive member 400 may be formed on a portion of the top surface of the two-dimensional layered semiconductor 200. In more detail, the non-conductive member 400 may be formed at an edge of the top surface of the two-dimensional layered semiconductor 200. As shown in FIG. 2, the Schottky contact layer 300 may be formed on the other portion of the top surface of the two-dimensional layered semiconductor 200 where the non-conductive member 400 is not formed. Therefore, partial surfaces of the non-conductive member 400 may be surrounded by the two-dimensional layered semiconductor 200 and the Schottky contact layer 300. The following is the reason for forming the non-conductive member 400: the two-dimensional layered semiconductor 200 may be formed to have the thin thickness of about 10 to 100 nm, and due to a fabrication error, the ohmic contact layer 100 and the Schottky contact layer 300 may thus be in direct electrical connection with each other at the outside of the vertical Schottky barrier diode in which the two-dimensional layered semiconductor 200 is not formed. That is, the non-conductive member 400 may be formed at the edge of the top surface of the two-dimensional layered semiconductor 200, thereby preventing the ohmic contact layer 100 and the Schottky contact layer 300 from being in direct electrical connection with each other at the outside of the vertical Schottky barrier diode according to the embodiment.

The non-conductive member 400 may be formed of a variety of non-conductive materials, and may typically be formed of silicon dioxide (SiO$_2$), aluminum oxide (Al$_2$O$_3$) and hafnium oxide (HfO$_2$), using a photoresist method.

Figure 3:
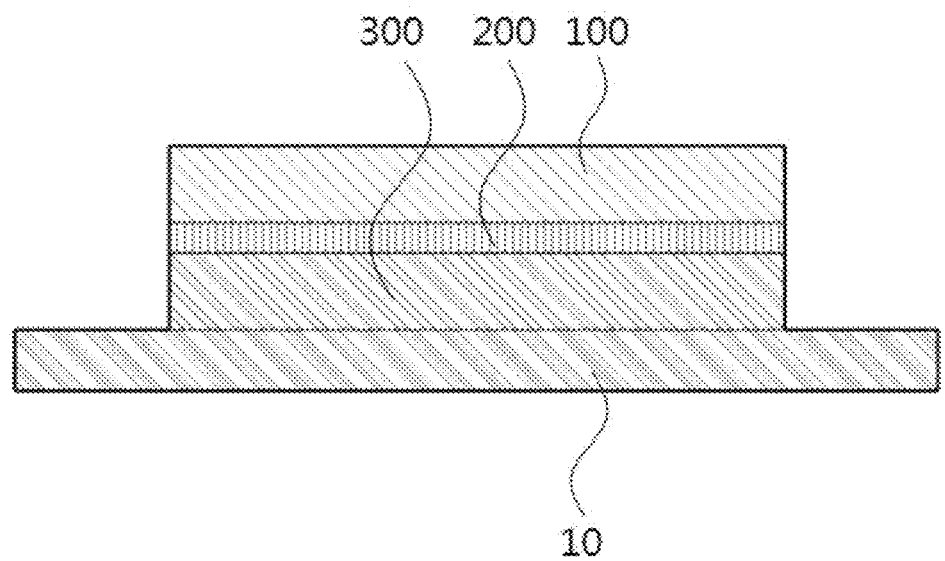
FIG. 3 is a cross-sectional view of a vertical Schottky barrier diode using a two-dimensional layered semiconductor according to a third embodiment of the present disclosure.

FIG. 3 is a schematic cross-sectional view of a vertical Schottky barrier diode according to a third embodiment of the present disclosure.

In the vertical Schottky barrier diode according to the first and second embodiments of the present disclosure, the ohmic contact layer 100 may be formed on the top surface of the non-conductive layer 10, but the present disclosure is not limited thereto. As in the third embodiment of the present disclosure shown in FIG. 3, the vertical Schottky barrier diode may include the Schottky contact layer 300, the two-dimensional layered semiconductor 200 and the ohmic contact layer 100 sequentially formed in order on the top surface of the non-conductive layer 10. A user or operator may select and implement the first, second or third embodiment for a change in design or for convenience.

In the vertical Schottky barrier diode according to the various embodiments of the present disclosure, the ohmic contact layer 100 and the Schottky contact layer 300 serving as electrodes may be in surface contact with the two-dimensional layered semiconductor 200, respectively. Therefore, the vertical Schottky barrier diode may have less resistance than a conventional horizontal Schottky diode, and thus be advantageous for its high speed and high frequency operation. The following description focuses on electrical characteristics of the present disclosure with reference to the following drawings.

Figure 4A:
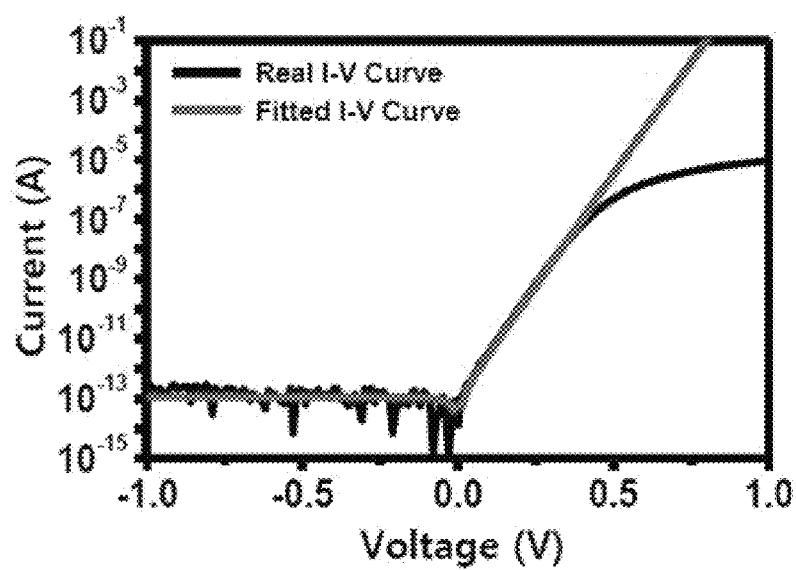
FIGS. 4A and 4B are graphs showing electrical characteristics of the vertical Schottky barrier diode using the two-dimensional layered semiconductor according to the first embodiment of the present disclosure.
Figure 4B:
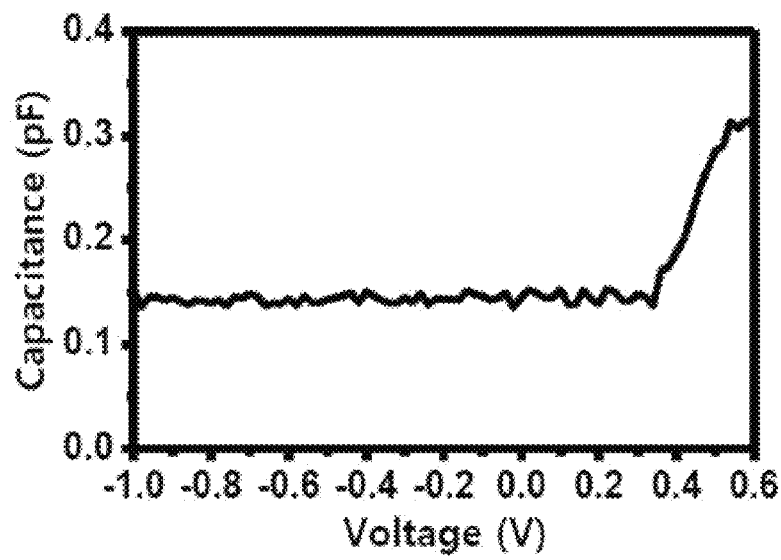

FIGS. 4A and 4B are graphs showing electrical characteristics of the vertical Schottky barrier diode according to the first embodiment of the present disclosure. The vertical Schottky barrier diode according to the first embodiment of the present disclosure may include the non-conductive layer 10 formed of glass, the ohmic contact layer 100 formed of platinum (Pt) or graphene, the two-dimensional layered semiconductor 200 formed of tungsten diselenide (WSe$_2$) of 10 to 100 nm thickness and Schottky contact layer 300 formed of indium tin oxide (no) or titanium (Ti). FIG. 4A shows a current-voltage characteristic graph of an ideal diode having its characteristics of very low power consumption and fast switching capability.

FIG. 4B is a graph of capacitance-voltage characteristics under the same conditions, and shows that in a reverse bias, a thickness of a depletion layer matches that of the two-dimensional layered material, thereby effectively preventing the current from leaking in a reverse direction. On the contrary, FIG. 4B shows a threshold voltage of about 0.4 V and a hole carrier concentration of about $1 \times 10^{17}$ cm$^{-3}$ through a change in capacitance depending on the voltage in the forward bias.

Figure 5A:
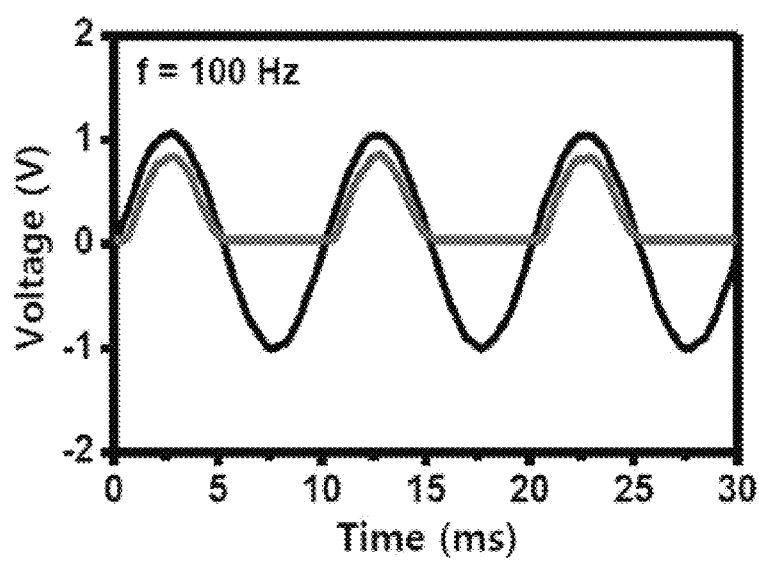
FIGS. 5A and 5B are graphs showing low frequency characteristics of the vertical Schottky barrier diode using the two-dimensional layered semiconductor according to the first embodiment of the present disclosure.
Figure 5B:
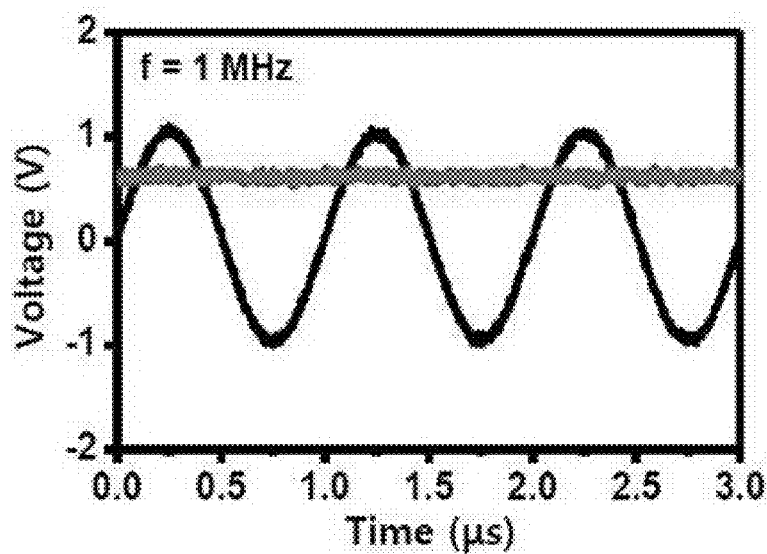

FIGS. 5A and 5B are graphs showing low frequency characteristics of the vertical Schottky barrier diode according to the first embodiment of the present disclosure. In more detail, FIG. 5A shows that an ideal rectification action is generated in a low frequency range when a signal is applied in an alternating current (AC) condition; and FIG. 5B shows that a direct current (DC) voltage converted from the AC flows as a capacitive reactance is decreased in a high frequency range.

Figure 6A:
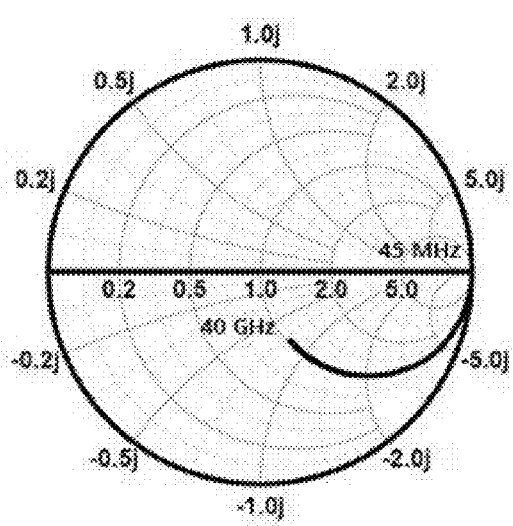
FIGS. 6A to 6C are graphs showing high frequency characteristics of the vertical Schottky barrier diode using the two-dimensional layered semiconductor according to the first embodiment of the present disclosure.
Figure 6B:
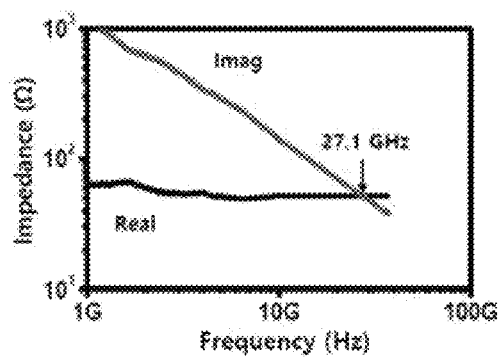
Figure 6C:
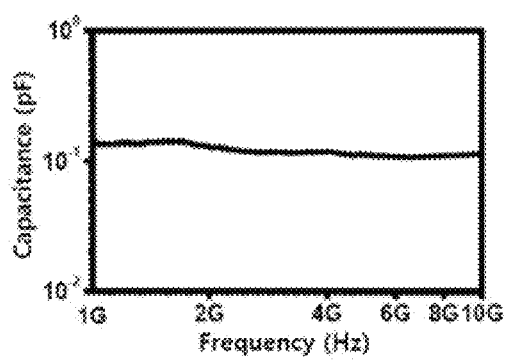

FIGS. 6A to 6C are graphs showing high frequency characteristics of the vertical Schottky barrier diode according to the first embodiment of the present disclosure. As a result of checking whether the diode is properly operated in an ultra-high frequency range of 45 MHz to 40 GHz under a condition in which the DC voltage is 0 V, the Schottky diode is confirmed to be operated up to a fairly high frequency range of 40 GHz or more from the Smith chart, and a high cutoff frequency of 27 GHz or more is obtained through an analysis of an impedance component. In addition, a junction capacity value obtained through the capacitive reactance in the AC condition is found to match a junction capacity value measured in the DC condition, and it is thus confirmed that the cutoff frequency varies depending on a contact area between the metal and the semiconductor and a thickness of the semiconductor from an equation of $f_c=1/(R_s C_j)$ representing the cutoff frequency. Here, $R_s$ may refer to a series resistance and $C_j$ may refer to a junction capacitance.

[Fabrication Method of Vertical Schottky Barrier Diode: First Embodiment]

Hereinafter, a fabrication method of a vertical Schottky barrier diode according to a first embodiment of the present disclosure is described in detail with reference to the accompanying drawings.

The fabrication method of the vertical Schottky barrier diode according to the first embodiment of the present disclosure may include steps A, B and C.

The step A may be a step of forming an ohmic contact layer 100 on a top surface of a non-conductive layer 10 using a metal, in which the ohmic contact layer 100 may be formed using dry transfer, wet transfer, thin film deposition or patterning processes, and no drawing separately shows the step A.

FIGS. 7A to 7E are schematic diagrams of steps B and C of the fabrication method of the vertical Schottky barrier diode according to the first embodiment of the present disclosure.

Figure 7A:
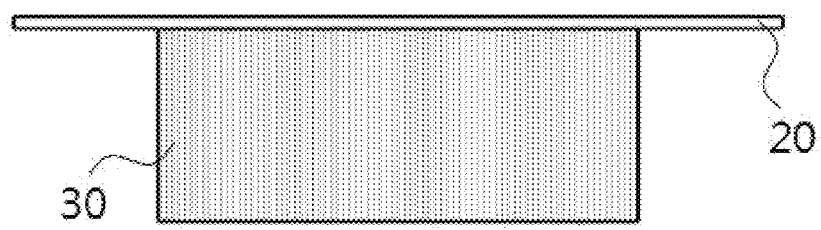
FIGS. 7A to 7E are schematic diagrams of fabricating a vertical Schottky barrier diode using a two-dimensional layered semiconductor according to a first embodiment of the present disclosure.
Figure 7B:
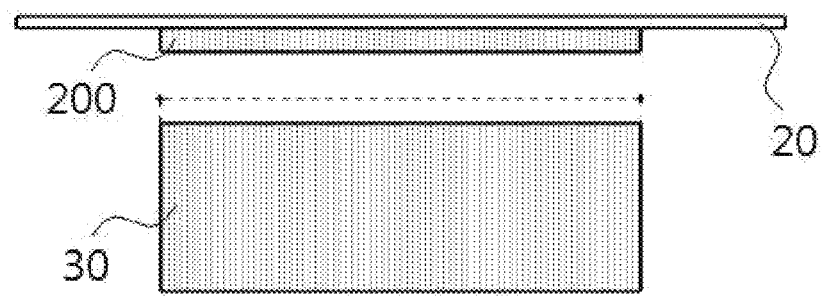
Figure 7C:
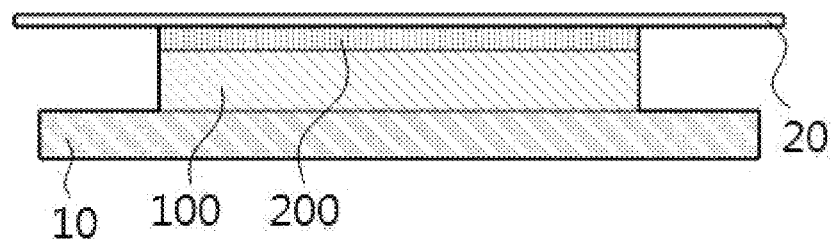
Figure 7D:
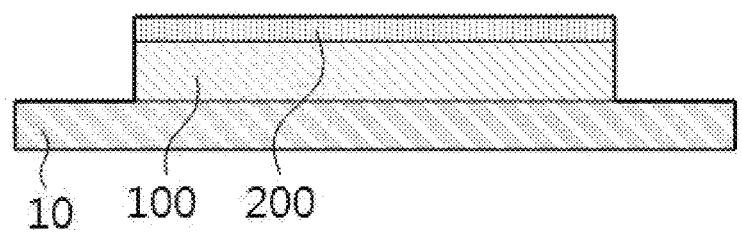

The step B may be a step of forming a two-dimensional layered semiconductor 200 on a top surface of the ohmic contact layer 100 formed in the step A using two-dimensional transition metal dichalcogenides (TMDs). In more detail, in the step B, an adhesive member 20 may be attached to a raw material 30 of the two-dimensional transition metal dichalcogenides as shown in FIG. 7A, and thereby the two-dimensional layered semiconductor 200 may be attached to one surface of the adhesive member 20 as shown in FIG. 7B. Next, in the step B, the one surface of the adhesive member 20 may be attached to the top surface of the ohmic contact layer 100 formed in the step A, pressed by a predetermined degree of pressure, and then removed as shown in FIG. 7C. In this manner, the two-dimensional layered semiconductor 200 may be formed on the top surface of the ohmic contact layer 100 as shown in FIG. 7D, and van der Waals forces may act in this process.

Figure 7E:
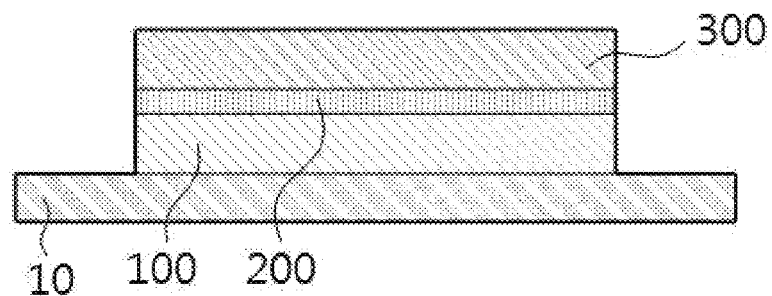

The step C may be a step of forming a Schottky contact layer 300 on one surface of the two-dimensional layered semiconductor 200 formed in the step B, thereby finally completing fabrication of the vertical Schottky barrier diode as shown in FIG. 7E. In the step C, the Schottky contact layer 300 may be formed using the dry transfer, wet transfer, thin film deposition or patterning processes.

The ohmic contact layer 100 may be formed in the step A of the fabrication method of the vertical Schottky barrier diode according to the first embodiment of the present disclosure described above, but the present disclosure is not limited thereto. There may be an embodiment in which in the step A, the Schottky contact layer 300 is first formed on the top surface of the non-conductive layer 10. In this case, in the step B, the two-dimensional layered semiconductor 200 may be formed on the top surface of the Schottky contact layer 300 using the same method as in the first embodiment; and in the step C, the ohmic contact layer 100 may be formed on the top surface of the two-dimensional layered semiconductor 200 formed in the step B.

[Fabrication Method of Vertical Schottky Barrier Diode: Second Embodiment]

A fabrication method of a vertical Schottky barrier diode according to a second embodiment of the present disclosure may refer to a method of forming the vertical Schottky barrier diode according to the second embodiment of the present disclosure described above. This embodiment may further include a step B-1 performed between the step B and the step C as compared to the fabrication method of the vertical Schottky barrier diode according to the first embodiment of the present disclosure described above.

FIGS. 8A to 8E are schematic diagrams of the step B-1 of the fabrication method of the vertical Schottky barrier diode according to the second embodiment of the present disclosure.

Figure 8A:
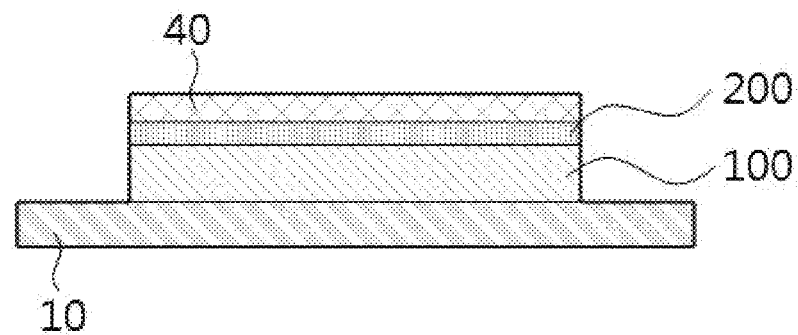
FIGS. 8A to 8E are schematic diagrams of fabricating a vertical Schottky barrier diode using a two-dimensional layered semiconductor according to a second embodiment of the present disclosure.
Figure 8B:
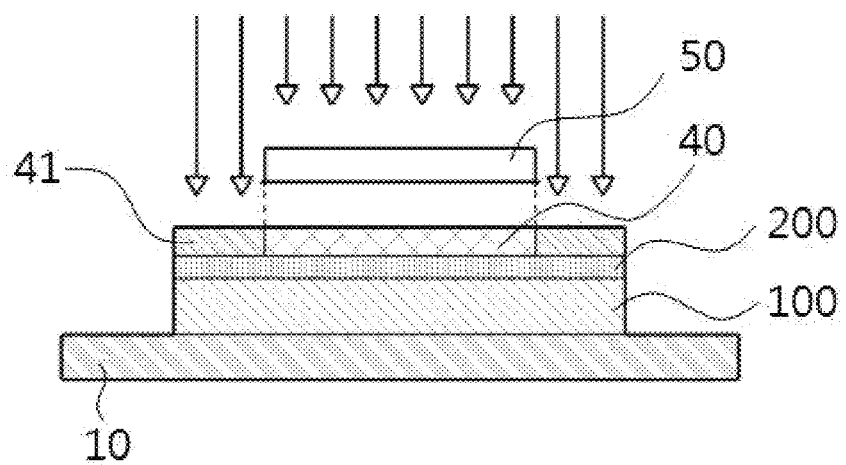
Figure 8C:
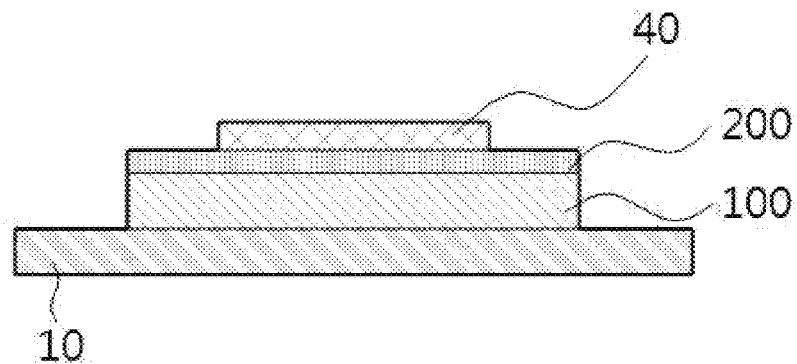
Figure 8D:
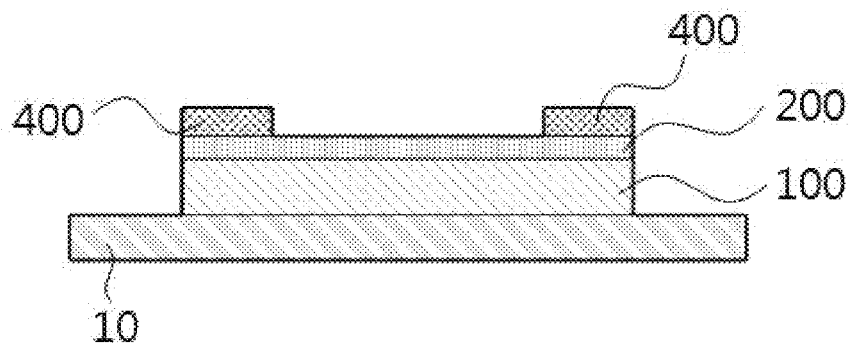
Figure 8E:
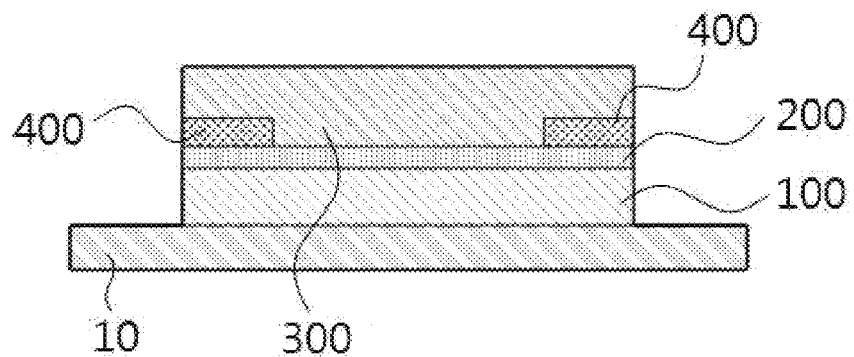

As shown in FIG. 8A, the step B-1 may be a step of forming a photoresist layer 40 on the top surface of the two-dimensional layered semiconductor 200 after the step B is performed to form a non-conductive member 400 on the top surface of the two-dimensional layered semiconductor 200. As shown in FIG. 8B, a mask 50 may then be applied to the rest except for a portion where the non-conductive member 400 is to be formed, and the photoresist layer 40 may then be exposed to form an exposed portion 41. As shown in FIG. 8C, in the step B-1, the exposed portion 41 may then be removed using a developer, and the non-conductive member 400 may then be formed using the dry transfer, the wet transfer, the thin film deposition or patterning processes. Then, when the remaining photoresist layer 40 is removed, only the non-conductive member 400 may remain on the top surface of the two-dimensional layered semiconductor 200 as shown in FIG. 8D. Then, in the step C, the Schottky contact layer 300 having a predetermined thickness may be formed on the top surface of the two-dimensional layered semiconductor 200 and the top surface of the non-conductive member 400 as shown in FIG. 8E. In this manner, it is possible to complete fabrication of the vertical Schottky barrier diode according to the second embodiment of the present disclosure.

As in this embodiment, in case that the ohmic contact layer 100 is first formed in the step A, the step B-1 may be performed after the step B and before the step C. In addition, in case that the Schottky contact layer 300 is first formed in the step A, the step B-1 of forming the non-conductive member 400 may be performed after the step B and before the step C in the same manner as in the previous case. To briefly describe this case, although not shown in a separate drawing, the vertical Schottky barrier diode may have the same configuration as the vertical Schottky barrier diode according to the second embodiment. However, in the step A, the Schottky contact layer 300 may first be formed on the top surface of the non-conductive layer 10; in the step B, the two-dimensional layered semiconductor 200 may be formed on the top surface of the Schottky contact layer 300; in the step B-1, the non-conductive member 400 may be formed at an edge of the two-dimensional layered semiconductor 200; and in the step C, the ohmic contact layer 100 may be formed on the top surface of the two-dimensional layered semiconductor 200 and the top surface of the non-conductive member 400.

As described above, according to the vertical Schottky barrier diode using the two-dimensional layered semiconductor and the fabrication method thereof according to the present disclosure, the two-dimensional layered semiconductor may be formed using the dry transfer or the wet transfer method instead of using the conventional material such as silicon or gallium arsenide, and the Schottky diode may thus be fabricated even at relatively low temperature, and may have improved convenience of fabrication.

In addition, according to the present disclosure, the ohmic contact layer, the two-dimensional layered semiconductor and the Schottky contact layer may be stacked on each other in a vertical direction, and each layer may thus be in surface contact with each other. Therefore, the vertical Schottky barrier diode of the present disclosure may have the reduced resistance and the improved response speed, and thus have the improved response characteristics in the high frequency region.

The present disclosure is not to be construed as being limited to the above-mentioned exemplary embodiments. The present disclosure may be applied to various fields and may be variously modified by those skilled in the art without departing from the scope of the present disclosure claimed in the claims. Therefore, it is obvious to those skilled in the art that these alterations and modifications fall in the scope of the present disclosure.

The invention claimed is:

1. A vertical Schottky barrier diode comprising:
an ohmic contact layer formed of a metal;
a two-dimensional layered semiconductor formed of two-dimensional transition metal dichalcogenides (TMDs) on one surface of the ohmic contact layer;
a Schottky contact layer formed on one surface of the two-dimensional layered semiconductor;
a non-conductive layer formed on the other surface of the ohmic contact layer or one surface of the Schottky contact layer; and
a non-conductive member formed on an edge of the one surface of the two-dimensional layered semiconductor and in surface contact with the two-dimensional layered semiconductor and the Schottky contact layer,
wherein the two-dimensional layered semiconductor is formed to have a thickness of 10 nm or more, and
the Schottky contact layer is formed only at a region where the ohmic contact layer is projected to the two-dimensional layered semiconductor.

2. The vertical Schottky barrier diode of claim 1, wherein the two-dimensional transition metal dichalcogenides (TMDs) forming the two-dimensional layered semiconductor contains any one selected from a group consisting of tungsten diselenide ($WSe_2$), tungsten disulfide ($WS_2$), molybdenum diselenide ($MoSe_2$), molybdenum disulfide ($MoS_2$), molybdenum ditelluride ($MoTe_2$), rhenium diselenide ($ReSe_2$) and rhenium disulfide ($ReS_2$).

3. The vertical Schottky barrier diode of claim 1, wherein the Schottky contact layer is formed of a Schottky metal or a conductive transparent oxide film.

4. The vertical Schottky barrier diode of claim 1, wherein the non-conductive layer is formed of any one selected from glass, plastic and polyimide.

5. The vertical Schottky barrier diode of claim 1, wherein the non-conductive layer is formed of a transparent material or an opaque material.

6. The vertical Schottky barrier diode of claim 1, wherein the non-conductive layer is hard by being formed of a material having predetermined rigidity or more or is flexible by being formed of a material having elasticity.

7. A fabrication method of a vertical Schottky barrier diode, comprising:
a step A of forming an ohmic contact layer on one surface of a non-conductive layer using a metal or forming a Schottky contact layer on the one surface of the non-conductive layer;

a step B of forming a two-dimensional layered semiconductor on one surface of the layer formed in the step A using two-dimensional transition metal dichalcogenides (TMDs), the two-dimensional layered semiconductor having a thickness of 10 nm or more;

a step B-1 of forming a non-conductive member on an edge of the one surface of the two-dimensional layered semiconductor; and a step C of forming the layer not formed in the step A among the ohmic contact layer and the Schottky contact layer at a region where the layer formed in the step A is projected to the two-dimensional layered semiconductor, on one surface of the two-dimensional layered semiconductor formed in the step B.

8. The fabrication method of a vertical Schottky barrier diode of claim 7, wherein in the step A or C, the ohmic contact layer or the Schottky contact layer is formed using dry transfer, wet transfer, thin film deposition and patterning processes.

9. The fabrication method of a vertical Schottky barrier diode of claim 7, wherein in the step B, the two-dimensional layered semiconductor is formed by attaching the two-dimensional layered semiconductor attached to a surface of an adhesive member to the one surface of the layer formed in the step A, and then removing the adhesive member.

10. The fabrication method of a vertical Schottky barrier diode of claim 7, wherein in the step B-1, the non-conductive member is formed using a photoresist method.

11. The fabrication method of a vertical Schottky barrier diode of claim 7, wherein in the step B-1, the non-conductive member is formed using a photoresist method.

12. The fabrication method of a vertical Schottky barrier diode of claim 7, wherein the two-dimensional transition metal dichalcogenides (TMDs) forming the two-dimensional layered semiconductor contains any one selected from a group consisting of tungsten diselenide ($WSe_2$), tungsten disulfide ($WS_2$), molybdenum diselenide ($MoSe_2$), molybdenum disulfide ($MoS_2$), molybdenum ditelluride ($MoTe_2$), rhenium diselenide ($ReSe_2$) and rhenium disulfide ($ReS_2$).

13. The fabrication method of a vertical Schottky barrier diode of claim 7, wherein the Schottky contact layer is formed of a Schottky metal or a conductive transparent oxide film.

14. The fabrication method of a vertical Schottky barrier diode of claim 7, wherein the non-conductive layer is formed of any one selected from glass, plastic and polyimide.

15. The fabrication method of a vertical Schottky barrier diode of claim 7, wherein the non-conductive layer is formed of a transparent material or an opaque material.

16. The fabrication method of a vertical Schottky barrier diode of claim 7, wherein the non-conductive layer is hard by being formed of a material having predetermined rigidity or more or is flexible by being formed of a material having elasticity.

* * * * *